US008829348B2

(12) United States Patent
Larsen et al.

(10) Patent No.: US 8,829,348 B2
(45) Date of Patent: Sep. 9, 2014

(54) PAIR ORBIT MANAGEMENT FOR COMMUNICATION CABLES

(75) Inventors: Wayne D. Larsen, Wylie, TX (US); Amid I. Hashim, Plano, TX (US); Bryan Scott Moffitt, Red Bank, NJ (US)

(73) Assignee: CommScope, Inc. of North Carolina, Hickory, NC (US)

( * ) Notice: Subject to any disclaimer, the term of this patent is extended or adjusted under 35 U.S.C. 154(b) by 333 days.

(21) Appl. No.: 13/396,025

(22) Filed: Feb. 14, 2012

(65) Prior Publication Data

US 2012/0205153 A1 Aug. 16, 2012

Related U.S. Application Data

(60) Provisional application No. 61/443,003, filed on Feb. 15, 2011.

(51) Int. Cl.

| | |
|---|---|
| ***H05K 5/00*** | (2006.01) |
| ***H05K 7/00*** | (2006.01) |
| ***G06F 1/16*** | (2006.01) |
| ***H01R 13/64*** | (2006.01) |
| ***H01R 24/00*** | (2011.01) |
| ***H01R 31/06*** | (2006.01) |
| ***H02G 3/04*** | (2006.01) |
| ***H02G 3/00*** | (2006.01) |
| ***H02G 7/00*** | (2006.01) |
| ***H01R 4/18*** | (2006.01) |
| ***H02G 15/18*** | (2006.01) |
| ***H01B 7/00*** | (2006.01) |
| ***H01R 4/00*** | (2006.01) |
| ***H01R 4/50*** | (2006.01) |
| ***H02G 15/08*** | (2006.01) |
| ***H02G 3/06*** | (2006.01) |
| *H01R 4/24* | (2006.01) |
| *H01R 13/60* | (2006.01) |
| *H01B 11/02* | (2006.01) |
| *H01R 13/46* | (2006.01) |

(52) U.S. Cl.

CPC .............. *H01R 31/06* (2013.01); *H01R 4/2416* (2013.01); *H01R 13/60* (2013.01); *H01B 11/02* (2013.01); *H01R 13/465* (2013.01)

USPC .................... 174/88 R; 361/679.01; 361/601; 439/248; 439/626; 439/628; 439/629; 439/630; 439/631; 174/68.1; 174/70 R; 174/71 R; 174/72 R; 174/84 R

(58) Field of Classification Search

USPC ............. 361/679.01, 601; 439/248, 626, 628, 439/629, 630, 631; 174/68.1, 70 R, 71 R, 174/72 R, 84 R, 88 R, 88 S

See application file for complete search history.

(56) References Cited

U.S. PATENT DOCUMENTS 3,474,384 A * 10/1969 Quackenbush ............... 439/135
6,181,262 B1 * 1/2001 Bennett ........................... 341/26

(Continued)

*Primary Examiner* — Anthony Haughton
(74) *Attorney, Agent, or Firm* — Myers Bigel Sibley & Sajovec, P.A.

(57) ABSTRACT

A communications cable includes a plurality of longitudinally extending pairs of conducting elements, a low profile male connector secured to a first end of the cable, and a low profile female connector secured to an opposite second end of the cable. The plurality of pairs of conducting elements terminate at the male connector in a first orientation and terminate at the female connector in a second orientation. The first and second orientations are such that each respective conducting element can be connected to itself when the male and female connectors are matingly engaged with each other.

14 Claims, 11 Drawing Sheets

(56) References Cited

U.S. PATENT DOCUMENTS

| | | | | |
|---|---|---|---|---|
| 6,540,522 | B2 * | 4/2003 | Sipe | 439/61 |
| 6,629,851 | B1 * | 10/2003 | Kikuchi et al. | 439/79 |
| 6,894,906 | B2 * | 5/2005 | Sivertsen | 361/796 |
| 7,929,310 | B2 * | 4/2011 | Belady et al. | 361/735 |
| 8,444,436 | B1 * | 5/2013 | Cohen et al. | 439/607.08 |
| 2002/0007198 | A1 * | 1/2002 | Haupert et al. | 607/30 |
| 2002/0181215 | A1 * | 12/2002 | Guenthner | 361/784 |
| 2003/0100198 | A1 * | 5/2003 | Hicks et al. | 439/65 |
| 2006/0002065 | A1 * | 1/2006 | Hua | 361/683 |

* cited by examiner

PAIR ORBIT MANAGEMENT FOR COMMUNICATION CABLES

RELATED APPLICATION

This application claims the benefit of and priority to U.S. Provisional Patent Application No. 61/443,003 filed Feb. 15, 2011, the disclosure of which is incorporated herein by reference as if set forth in its entirety.

FIELD OF THE INVENTION

The present invention relates generally to communications and, more particularly, to communications cables.

BACKGROUND

Many entities have dedicated communications systems that enable computers, servers, printers, facsimile machines and the like to communicate with each other, through a private network, and with remote locations via a telecommunications service provider. Such communications systems may be hard wired through, for example, the walls and/or ceilings of a facility using communications cables that typically contain eight conductive wires. The eight conductive wires are arranged as four differential twisted pairs of conductors that may be used to transmit four separate differential signals. In such hard wired systems, individual connector ports such as RJ-45 style modular wall jacks (also referred to as telecommunications outlets) are mounted in locations (e.g., offices, conference rooms, reception areas, etc.) throughout the facility. The communications cables electrically connect each telecommunications outlet to network equipment (e.g., network servers, routers, switches, servers, etc.) that may be located in a computer room. Communications cables from external telecommunication service providers may also terminate within the computer room.

Typically, the information signals transmitted between networked devices (e.g., a desk top computer and network server) are transmitted over a pair of conductors rather than over a single conductor. The cascaded plugs, jacks and cabling segments that provide connectivity between two end devices (e.g., a desk top computer and network server, etc.) is referred to as a channel.

The communications cables may be connected to the network equipment through a communications patching system. Typically, a communications patching system includes a plurality of "patch panels" that are io mounted on one or more equipment racks. As is known to those of skill in the art, a "patch panel" refers to an inter-connection device that includes a plurality of connector ports such as, for example, RJ-45 style communications jacks, on a front side thereof. Each connector port (e.g., a jack) is configured to receive a first communications cable that is terminated with a mating connector (e.g., a plug). Typically, a second communications cable is terminated into the reverse side of each connector port by terminating the eight conductive wires of the cable into corresponding insulation displacement contacts of the connector port. Each connector port on the patch panel may provide communications paths between a first communications cable that is plugged into the front side of the connector port and a second communications cable that is terminated into the reverse side of the connector port. The communications patching system may optionally include a variety of additional equipment such as rack managers, system managers and other devices that facilitate making and/or tracking interconnections between networked devices.

FIG. 1A illustrates a conventional communications cable 10, such as a Category 5 (CAT5) cable that includes eight wires twisted together to form four pairs 12, 14, 16, 18. Conventionally, each pair is color coded with one wire having a solid color (blue, orange, green or brown) twisted around a second wire with a white background and a stripe of the same color (i.e., blue, orange, green or brown). Each wire includes a conductive element surrounded by insulation that contains the color code on an outside surface thereof. FIG. 1B is an enlarged cross-sectional view of the communications cable 10 of FIG. 1A illustrating the "pair orbit" of the four twisted pairs. The term "pair orbit" refers to the orientation of the twisted pairs relative to each other. For example, beginning with the pair at the top left in FIG. 1B and moving clockwise, the cable has a pair orbit of Blue 12, Orange 18, Brown 16, and Green 14.

A twisted pair communications channel typically has a maximum length of about 328 feet. Beyond this length there is a risk of signal loss and other complications. However, because of the layout of various facilities, this length is typically comprised of a number of interconnected cable segments. As such, multiple cables are often required to be connected together in series in a particular channel. During cabling installation, a technician interconnects these cables together by means of connecting hardware (e.g., plugs, outlets, patch panels, etc.) such that each differential pair is continuous in the connected channel. In other words, it is important for the blue pair in a first cable to be connected to the blue pair in a second cable, for the orange pair in the first cable to be connected to the orange pair in the second cable, for the green pair in the first cable to be connected to the green pair in the second cable, and for the brown pair in the first cable to be connected to the brown pair in the second cable, etc. In order to accomplish this and maintain proper pair orbit, connectors are conventionally utilized to join cables together in a communications channel. Unfortunately, this can be detrimental to channel performance since these conventional connectors can aggravate various types of signal impairments, such as crosstalk and impedance mismatching. Moreover, the structure of conventional connector plugs and jacks can add to capacitive loading which may be detrimental to channel performance.

SUMMARY

It should be appreciated that this Summary is provided to introduce a selection of concepts in a simplified form, the concepts being further described below in the Detailed Description. This Summary is not intended to identify key features or essential features of this disclosure, nor is it intended to limit the scope of the invention.

According to some embodiments of the present invention, a communications cable includes a plurality of longitudinally extending conducting elements (e.g., twisted pairs of conducting elements, such as four twisted pairs) of, a low profile male connector secured to a first end of the cable, and a low profile female connector secured to an opposite second end of the cable. The plurality of pairs of conducting elements terminate at the male connector in a first orientation and terminate at the female connector in a second orientation. The first and second orientations are such that each respective conducting element can be connected to itself when the male and female connectors are matingly engaged with each other.

The low profile male connector includes a core having a plurality of circumferentially spaced-apart chambers. Each chamber has a termination block that receives the conducting elements of a respective pair, and each termination block includes a pair of termination connectors, such as insulation-displacement connectors. Each termination connector is electrically connected to a respective conducting element of a pair. A collar surrounds the core and is configured to secure the core to the cable jacket. A free end of the core extends outwardly from a free end of collar.

The low profile female connector also includes a core having a plurality of circumferentially spaced-apart chambers. Each compartment has a termination block that receives the conducting elements of a respective pair, and each termination block includes a pair of termination connectors, such as insulation piercing connectors. Each termination connector is electrically connected to a respective conducting element of a pair. A collar surrounds the core and is configured to secure the core to the cable jacket. The core is recessed within the collar to form a receptacle for receiving a male connector.

In some embodiments of the present invention, the core of both male and female connectors includes four circumferentially spaced apart chambers, each configured to receive a respective pair of conducting elements therein. In other embodiments of the present invention, the core of both male and female connectors may support five pairs of conducting elements. For example, the core may include a first chamber with four chambers circumferentially spaced apart around the first chamber. Alternatively, the core may include five circumferentially spaced apart chambers.

In some embodiments of the present invention, the jacket of the cable and/or the male and female connectors includes indicia (e.g., arrows or other markings) that indicates a direction that the male and/or female connector should be oriented towards when the communications cable is installed in a communication channel of a network. In some embodiments, the cable jacket may include indicia adjacent to the male connector that identifies the male connector and indicia adjacent to the female connector that identifies the female connector.

Low profile male and female connectors for communications cables, according to embodiments of the present invention, can be installed in the factory (i.e., preterminated cables) and in the field at low cost because complex equipment and soldering are not required. Moreover, various plug end and jack end adapters can be utilized with communications cables, according to embodiments of the present invention, to facilitate backwards compatibility with existing equipment and devices.

Because of the low profile of male and female connectors according to embodiments of the present invention, communications cables can be pulled easily through raceways. In addition, male and female connectors, according to embodiments of the present invention, contribute very little to performance loss of a communications channel.

According to some embodiments of the present invention, a communication channel for a network includes a plurality of communications cables connected in series. The cables connect an upstream port of a network device with a downstream telecommunications outlet that is remotely located from the network device. Each cable includes a plurality of longitudinally extending pairs of conducting elements, and each conducting element has a respective color code. Each cable includes a male connector at one end and a female connector at an opposite end. The plurality of pairs of conducting elements of each cable terminate at the male connector in a first orientation and terminate at the female connector in a second orientation. The communications cables are connected in series such that a male connector of an upstream communication cable matingly engages a female connector of a downstream communication cable. The first and second orientations are such that each respective conducting element in an upstream cable is connected to a conducting element having the same color code in a downstream cable.

Embodiments of the present invention maintain uniform twisted pair rotation throughout multiple cables connected together. This uniform twisted pair rotation eliminates crossovers of twisted pairs and, thus, does not disturb the impedance structure of the cables in a communication channel.

According to some embodiments of the present invention, a communication channel for a network includes first and second communications cables connected in series via a crossover connector. Each communications cable includes a plurality of longitudinally extending pairs of conducting elements terminating at each end in a first orientation. The crossover connector changes the orientation of the pairs of conducting elements to a second orientation different from the first orientation.

It is noted that aspects of the invention described with respect to one embodiment may be incorporated in a different embodiment although not specifically described relative thereto. That is, all embodiments and/or features of any embodiment can be combined in any way and/or combination. Applicant reserves the right to change any originally filed claim or file any new claim accordingly, including the right to be able to amend any originally filed claim to depend from and/or incorporate any feature of any other claim although not originally claimed in that manner. These and other objects and/or aspects of the present invention are explained in detail below.

DETAILED DESCRIPTION

Figure 1B:
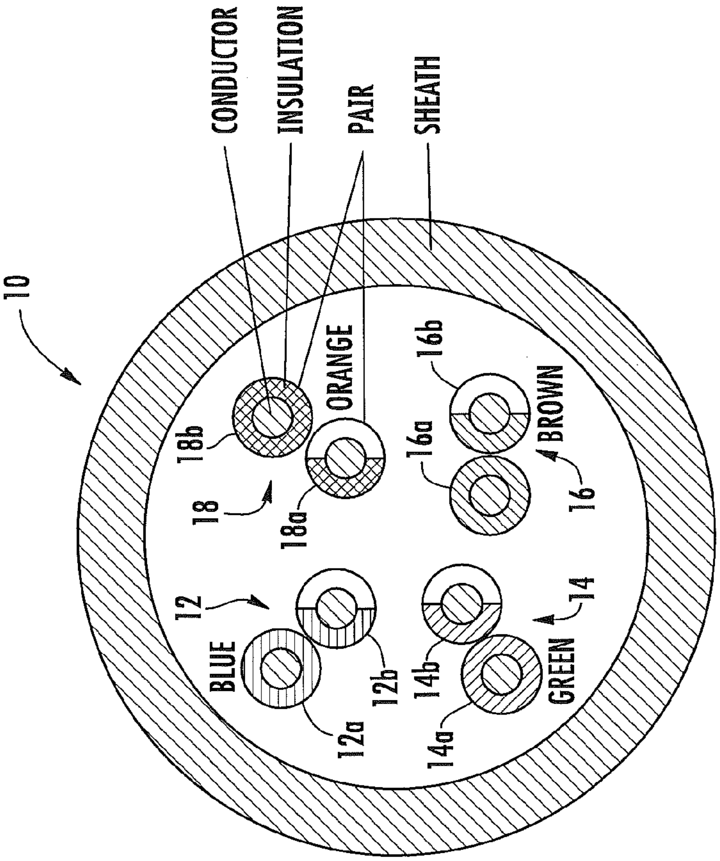
FIG. 1B (PRIOR ART)
FIG. 1B is an enlarged cross-sectional view of the communications cable of FIG. 1A and illustrates the “pair orbit” of the four twisted pairs.

The present invention will now be described more fully hereinafter with reference to the accompanying figures, in which embodiments of the invention are shown. This invention may, however, be embodied in many different forms and should not be construed as limited to the embodiments set forth herein. Like numbers refer to like elements throughout. In the figures, certain components or features may be exaggerated for clarity, and broken lines may be used to illustrate optional features or elements unless specified otherwise. In addition, the sequence of operations (or steps) is not limited to the order presented in the figures and/or claims unless specifically indicated otherwise. Features described with respect to one figure or embodiment can be associated with another embodiment of figure although not specifically described or shown as such.

It will be understood that when a feature or element is referred to as being "on" another feature or element, it can be directly on the other feature or element or intervening features and/or elements may also be present. In contrast, when a feature or element is referred to as being "directly on" another feature or element, there are no intervening features or elements present. It will also be understood that, when a feature or element is referred to as being "connected", "attached" or "coupled" to another feature or element, it can be directly connected, attached or coupled to the other feature or element or intervening features or elements may be present. In contrast, when a feature or element is referred to as being "directly connected", "directly attached" or "directly coupled" to another feature or element, there are no intervening features or elements present.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, steps, operations, elements, and/or components, but do not preclude the presence or addition of one or more other features, steps, operations, elements, components, and/or groups thereof. As used herein, the term "and/or" includes any and all combinations of one or more of the associated listed items and may be abbreviated as "/".

Spatially relative terms, such as "under", "below", "lower", "over", "upper" and the like, may be used herein for ease of description to describe one element or feature's relationship to another element(s) or feature(s) as illustrated in the figures. It will be understood that the spatially relative terms are intended to encompass different orientations of a device in use or operation in addition to the orientation depicted in the figures. For example, if a device in the figures is inverted, elements described as "under" or "beneath" other elements or features would then be oriented "over" the other elements or features. Thus, the exemplary term "under" can encompass both an orientation of over and under. The device may be otherwise oriented (rotated 90 degrees or at other orientations) and the spatially relative descriptors used herein interpreted accordingly. Similarly, the terms "upwardly", "downwardly", "vertical", "horizontal" and the like are used herein for the purpose of explanation only unless specifically indicated otherwise.

It will be understood that although the terms first and second are used herein to describe various features or elements, these features or elements should not be limited by these terms. These terms are only used to distinguish one feature or element from another feature or element. Thus, a first feature or element discussed below could be termed a second feature or element, and similarly, a second feature or element discussed below could be termed a first feature or element without departing from the teachings of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the specification and relevant art and should not be interpreted in an idealized or overly formal sense unless expressly so defined herein. Well-known functions or constructions may not be described in detail for brevity and/or clarity.

The term "communications cable", as used herein, is intended to include any type of cable having one or more conducting elements, that conduct electricity or light, surrounded by a protective sheath or jacket. Although specifically described herein with respect to communications cables having twisted pairs of conducting elements, communications cables, according to embodiments of the present invention may include other types of cables including, but not limited to, multi-core coaxial cables and multi-core fiber cables.

Moreover, embodiments of the present invention are not limited to twisted pairs of conducting elements. Pairs of conducting elements need not be twisted. The term "conducting element", as used herein, is intended to include electrically conducting wires (e.g., copper wire, etc.) and also to include light conducting wires such as fiber optic cables, optical fibers, etc.

Communications cables, according to embodiments of the present invention, can be used in a variety of structured cabling applications including patch cords, zone cords, backbone cabling, and horizontal cabling, although the present invention is not limited to such applications. In general, embodiments of the present invention can be used in military, industrial, residential, telecommunications, computer, data communications, and other cabling applications.

Figure 2:
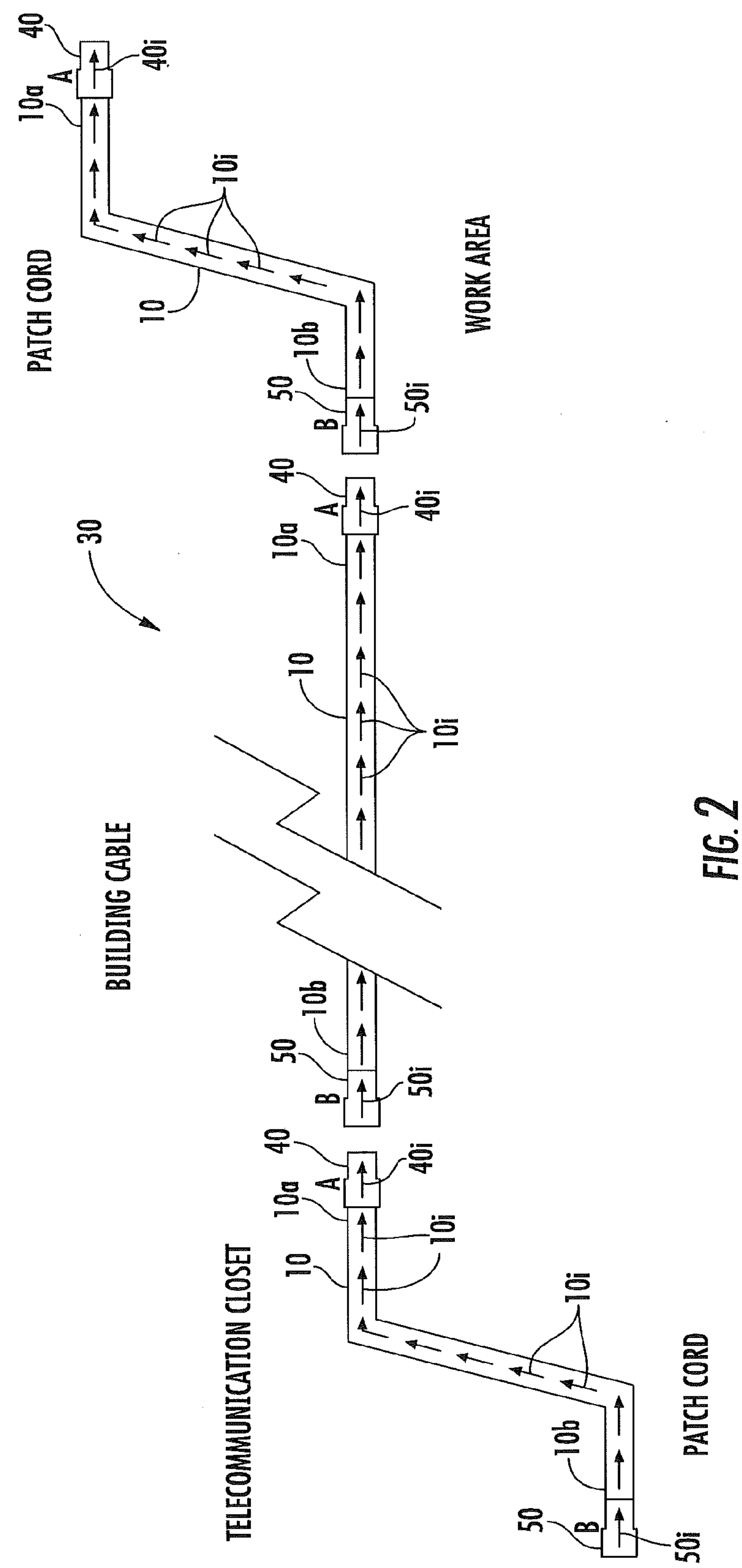
FIG. 2 is a schematic illustration of a communications channel wherein each cable utilizes oppositely gendered, non-crossed core connectors that mate together, according to some embodiments of the present invention.

Referring now to FIG. 2, a communications channel 30 for a network, according to some embodiments of the present invention, is illustrated. The illustrated communications channel 30 includes a plurality of communications cables 10 connected in series via opposite gender, low profile connectors. The female connector 50 of the most upstream cable 10 is typically connected to a communication port of a network hub device (not shown) located in a telecommunications closet (e.g., a router, a network switch, a server, etc), and the male connector 40 of the furthest downstream cable 10 is typically connected to a communications port of a remote terminal device (not shown) located in a work area (e.g., a desktop computer, a printer, etc.). Only three cables 10 are illustrated in FIG. 2. However, it is understood that any number of cables 10 may be cascaded to form a communications channel (or portion thereof) according to embodiments of the present invention.

Figure 1A:
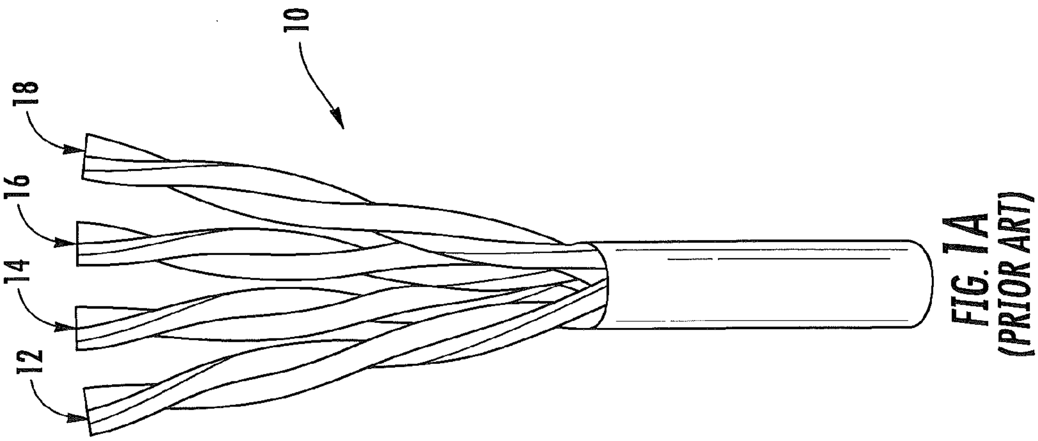
FIG. 1A (PRIOR ART)
FIG. 1A is a partial plan view of a conventional communications cable with the jacket partially removed to illustrate eight wires twisted together to form four pairs.

Each cable 10 includes a plurality of longitudinally extending twisted pairs of conducting elements (e.g., 12, 14, 16, 18, FIGS. 1A-1B), and each conducting element (e.g., 12*a*, 12*b*, 14*a*, 14*b*, 16*a*, 16*b*, 18*a*, 18*b*) has a respective color code as discussed above with respect to FIGS. 1A-1B (i.e., the insulation surrounding each conducting element has a color code on an outer surface thereof). Each cable 10 includes a low profile male connector 40 at one end 10*a* and a low profile female connector 50 at an opposite end 10*b*. As will be described below, the plurality of twisted pairs of each cable 10 terminate at the male connector 40 in a first orientation and terminate at the female connector 50 in a second orientation that is different from the first orientation. The communications cables 10 are connected in series such that a male connector 40 of an upstream communications cable 10 matingly engages a female connector 50 of a downstream communications cable 10. The first and second orientations are such that each respective conducting element (e.g., 12*a*, 12*b*, 14*a*, 14*b*, 16*a*, 16*b*, 18*a*, 18*b*, FIGS. 1A, 1B) in an upstream cable 10 is connected to a conducting element (e.g., 12*a*, 12*b*, 14*a*, 14*b*, 16*a*, 16*b*, 18*a*, 18*b*, FIGS. 1A, 1B) having the same color code in a downstream cable 10.

Figure 3A:
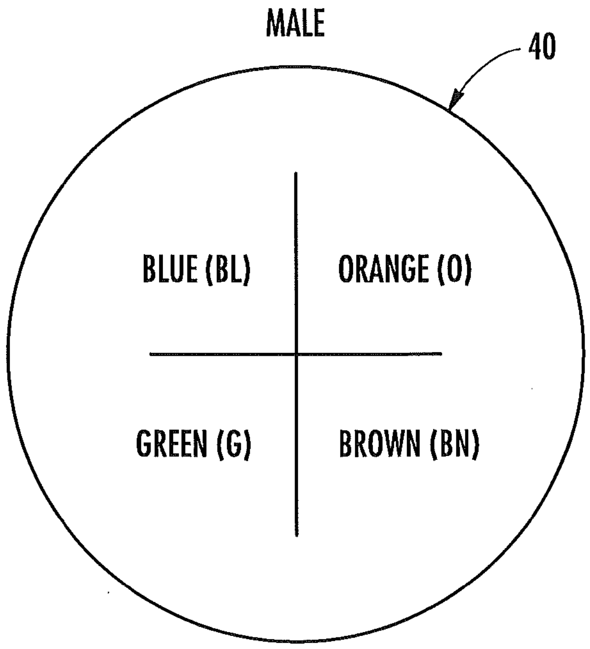
FIG. 3A is a schematic illustration of the pair orbit of four twisted pairs at a male connector, according to some embodiments of the present invention.
Figure 3B:
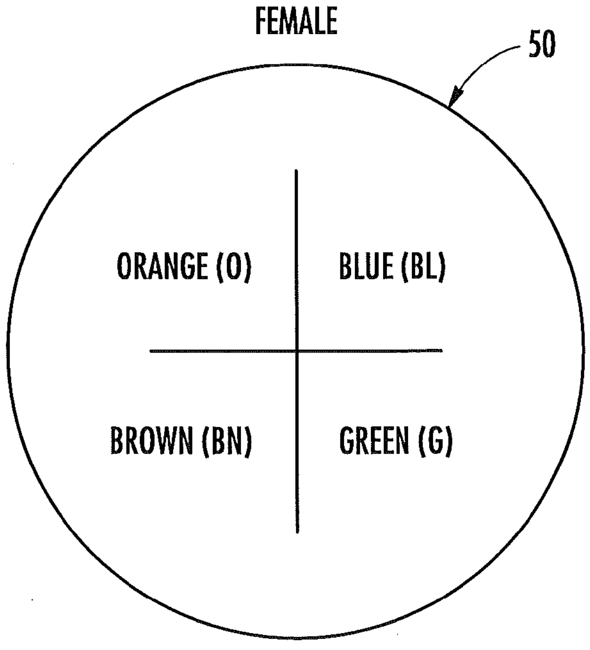
FIG. 3B is a schematic illustration of the pair orbit of four twisted pairs at a female connector, according to some embodiments of the present invention.

Exemplary first and second orientations of the twisted pairs of conducting elements at the male and female connectors 40, 50 are illustrated in FIGS. 3A and 3B, respectively. As illustrated in FIG. 3B, the twisted pair orientation of the female connector 50 is a mirror image of the twisted pair orientation of the male connector 40 of FIG. 3A. As such, for a single cable 10, when the male connector 40 at one end 10*a* is inserted within the female connector 50 at the other end 10*b*, the twisted pairs are aligned and the individual conducting elements of each twisted pair are electrically continuous.

Figure 4A:
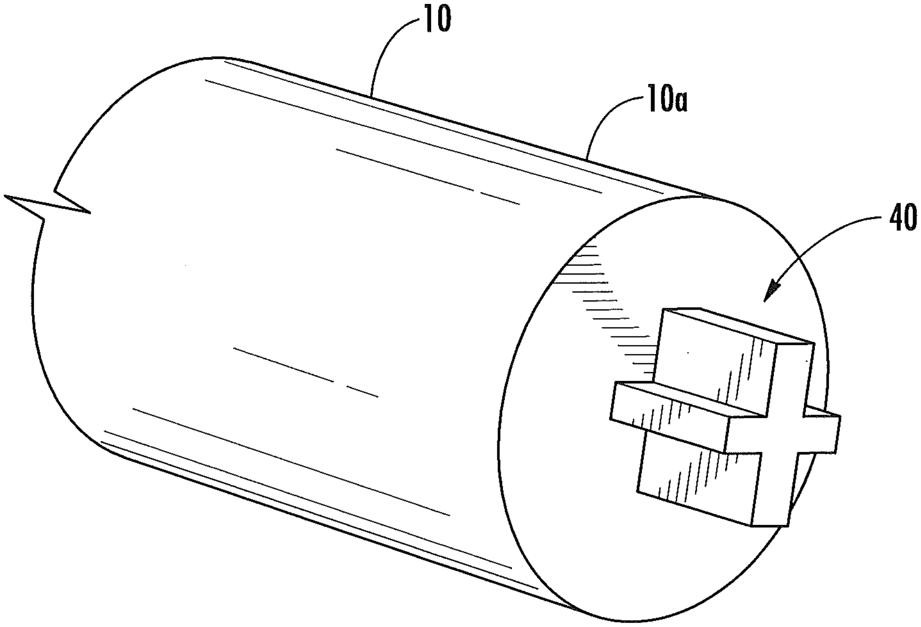
FIG. 4A is a perspective view of an end of a cable having a male connector, according to some embodiments of the present invention.
Figure 4B:
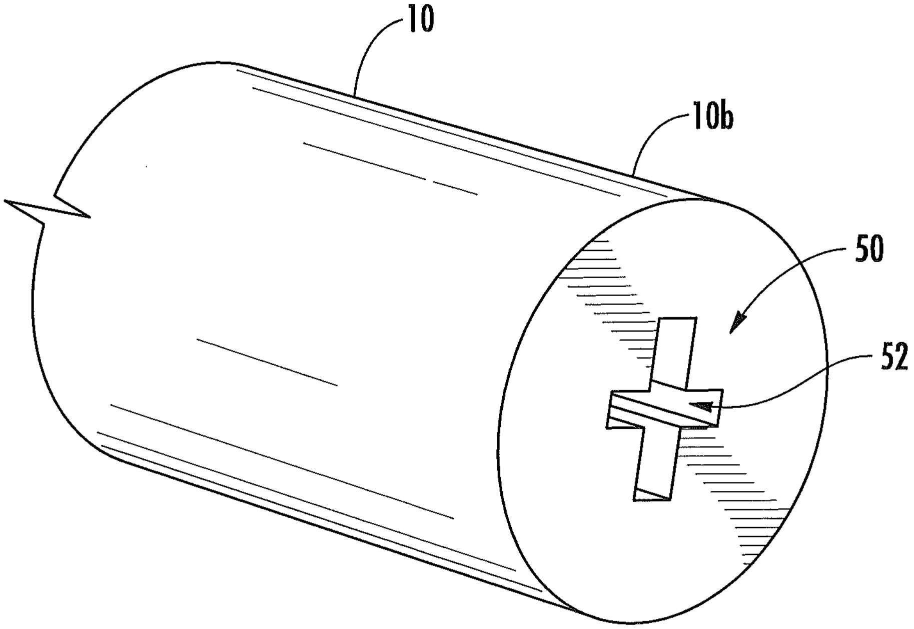
FIG. 4B is a perspective view of an end of a cable having a female connector configured to matingly receive the male connector of FIG. 4A, according to some embodiments of the present invention.

FIG. 4A is a perspective view of an end 10*a* of a cable 10 having a male connector 40, and FIG. 4B is a perspective view of an end 10*b* of a cable 10 having a female connector 50 configured to matingly receive the male connector 40 of FIG. 4A, according to some embodiments of the present invention. The configuration of male and female connectors 40, 50, according to embodiments of the present invention, is designed to ensure that when two cables 10 are connected together in series, each respective conducting element in one cable is connected to a conducting element having the same color code in the other cable. Embodiments of the present invention are not limited to the cross-shaped configurations of the male and female connectors 40, 50 of FIGS. 4A-4B. Male and female connectors that are configured to matingly engage each other can have any configuration, without limitation.

Figure 5:
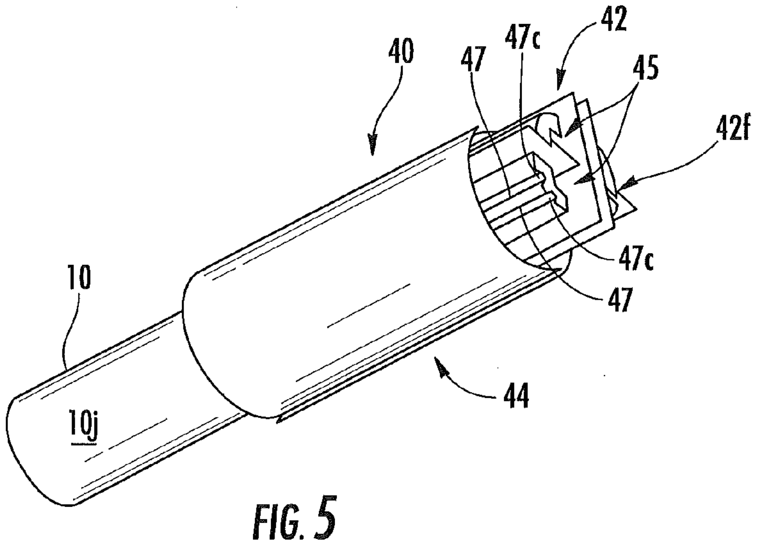
FIG. 5 is a perspective view of a male connector connected to an end of a communications cable, according to some embodiments of the present invention.

Referring now to FIGS. 5-8, a male connector 40 connected to the end of a cable 10, according to some embodiments of the present invention, is illustrated. FIG. 5 illustrates the male connector 40 in an installed configuration with the conductive elements (not shown) of the respective twisted pairs secured thereto. The illustrated male connector 40 includes a core 42 and a collar 44 that surrounds the core and secures it to the cable jacket 10*j*. The illustrated core 42 has a plurality of circumferentially spaced-apart chambers 45 that are utilized to arrange the twisted pairs of conducting elements in a particular orientation.

In the illustrated embodiment, the core 42 includes four chambers configured to receive four twisted pairs (i.e., one twisted pair per chamber). However, in other embodiments, the core 42 may have more than four chambers so as to accommodate more than four twisted pairs. For example, as will be described below with respect to FIGS. 13A and 13B, a core 42 may have five chambers 45 for receiving five respective twisted pairs.

Figure 6:
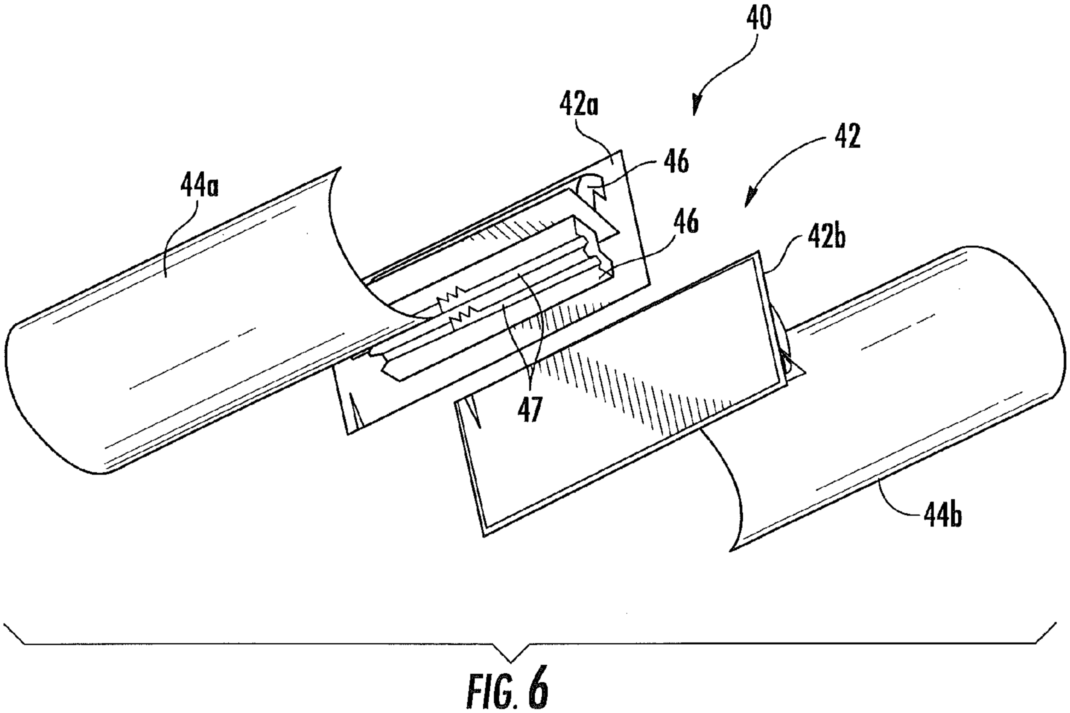
FIG. 6 is an exploded perspective view of the male connector of FIG. 5.

In the illustrated embodiment, the core 42 is formed from two "T-shaped" components 42*a*, 42*b* that are joined together to form a "cross-shaped" core 42. The T-shaped components 42*a*, 42*b* of the core 42 may be formed from any type of dielectric material including, but not limited to, PET (polyethylene terephthalate), PI (polyimide), PEN (polyethylene naphthalate), PEI (polyethyleneimine), and the like. The illustrated collar 44 is also formed of two components 44*a*, 44*b* that are joined together around the core 42 and typically is formed from dielectric material. FIG. 6 is an exploded perspective view of the core 42 of FIG. 5 illustrating core components 42*a*, 42*b* and collar components 44*a*, 44*b*.

Figure 7:
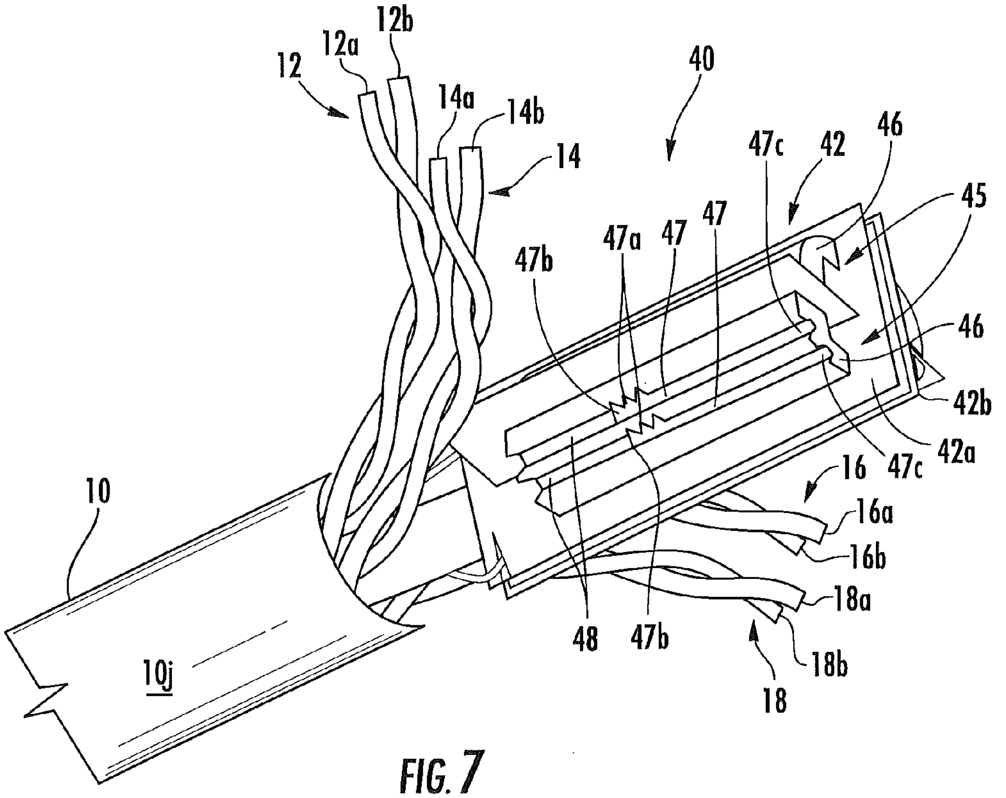
FIG. 7 illustrates the male connector of FIG. 5 with the cover removed and with a communications cable with four twisted pairs to be secured to the connector.

Referring to FIG. 7, each chamber 45 of the illustrated core 42 includes a termination block 46 configured to receive and secure the conducting io elements of a respective twisted pair. In the illustrated embodiment, each termination block 46 includes a pair of conductive termination connectors 47 and a pair of receiving channels 48. Each receiving channel 48 includes a respective termination connector 47 secured therewithin. The termination blocks 46 may be formed from any type of dielectric material including, but not limited to, PET (polyethylene terephthalate), PI (polyimide), PEN (polyethylene naphthalate), PEI (polyethyleneimine), and the like. The termination connectors 47 may be formed from one or more suitable electrically conductive and/or metallic materials, such as copper-based brass material, aluminum, metal-plated material, and the like.

The illustrated termination connectors 47 are insulation-displacement connectors (also referred to as "insulation-piercing" connectors) and include teeth 47*a* that are designed to pierce the insulation surrounding a conducting element and make electrical contact with the conducting element without requiring removal of the insulation and without requiring a soldered connection. Insulation-piercing connectors are well known to those skilled in the art of the present invention and need not be described further herein. Embodiments of the present invention, however, are not limited to the use of insulation-piercing connectors. Various types of connectors known to those of skill in the art may be utilized in accordance with embodiments of the present invention.

Each of the illustrated termination connectors 47 has an elongated configuration with opposite first and second end portions 47*b*, 47*c*. The teeth 47*a* are located adjacent the first end portion 47*b* and the second end portion 47*c* is positioned at an end of the termination block 46, as illustrated. When the male connector 40 of a first cable 10 is inserted within a female connector 50 of a second cable 10, the second end portions 47*c* of each respective termination connector 47 in the male connector 40 of the first cable 10 makes contact with a respective termination connector in the female connector 50 of the second cable 10 such that each conducting element in the first cable 10 is in electrical communication with a respective conducting element (with the same color code) in the second cable 10.

Figure 8:
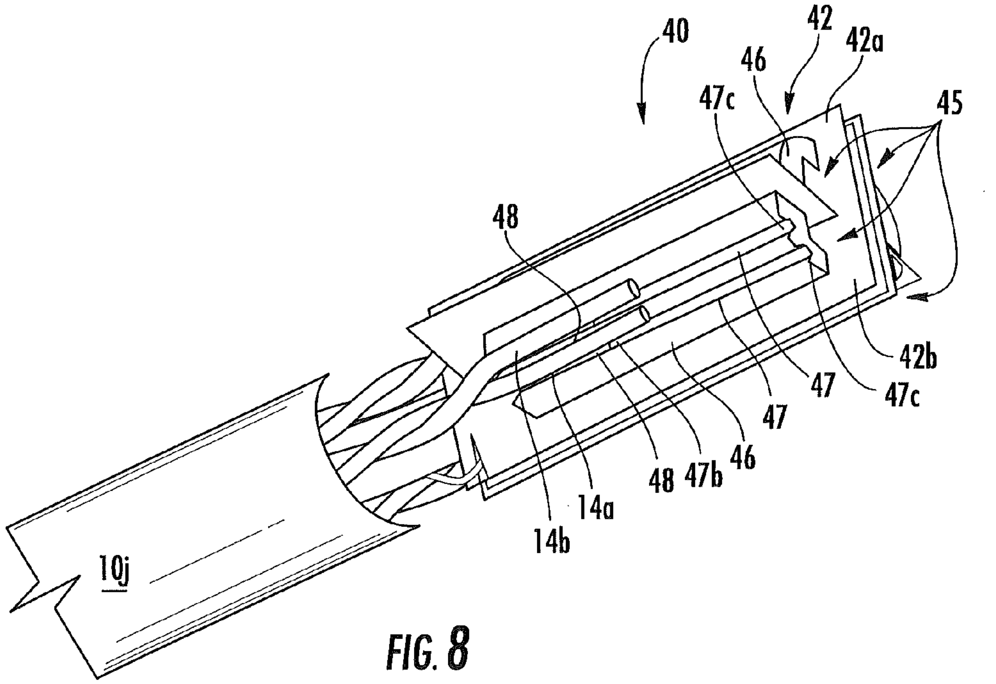
FIG. 8 illustrates the male connector of FIG. 7 with the twisted pairs secured to the connector within respective chambers, according to some embodiments of the present invention.

In FIG. 8, each twisted pair (12, 14, 16, 18) is located within a respective chamber 45, and each respective conducting element (12*a*, 12*b*, 14*a*, 14*b*, 16*a*, 16*b*, 18*a*, 18*b*) is secured to a respective termination connector 47. The collar 44 is not illustrated in FIGS. 7 and 8 for clarity.

Referring back to FIG. 5, a portion of the free end 42*f* of the core 40 extends outwardly from the collar 44. This free end portion 42*f* is configured to matingly engage a female connector 50 on another cable 10.

A female connector 50 configured to receive the male connector 40 of FIGS. 5-8, will have a similar core 42 and collar 44 as described above with respect to the male connector 40 of FIGS. 5-8, but the female connector core is recessed within a collar to form a receptacle for matingly receiving the free end portion 42*f* of the core 42 of the male connector 40. The core of the female connector 50 will also include respective circumferentially spaced-apart chambers, and each chamber will include a termination block that receives the conducting elements of a respective twisted pair, as described above. Each termination block of a female connector 50 will also include a pair of termination connectors, each electrically connected to a respective conductive element of a twisted pair. The female connector 50 will also include a collar that surrounds the core and that secures the core to the cable jacket.

Referring back to FIG. 2, in some embodiments of the present invention, the jacket 10*j* of a communications cable 10, according to embodiments of the present invention, includes indicia 10*i* that indicates a direction that the male and female connectors 40, 50 should be oriented when the communications cable 10 is installed in a communication channel 30. In the illustrated embodiment, the jacket 10*j* of each cable 10 includes arrows 10*i* that indicate the downstream direction of the communications channel 30. In the illustrated configuration, all male connectors 40 are pointed downstream and all female connectors 50 are pointed upstream. Also, in the illustrated embodiment, the male and female connectors 40, 50 also include indicia 40*i*, 50*i*, respectively, that indicates a direction that the male and female connectors 40, 50 should be oriented when the communications cables 10 are connected to form the communications channel 30. While the above description applies to cabling installations where factory-terminated cables are installed, the arrows also provide guidance to the installers in field terminated installations where un-terminated cables are cut to size as they are being installed and the connectors secured to them later. In such cases un-terminated cable segments are installed with all arrows pointing in the same direction (e.g., downstream as shown in FIG. 2). This ensures conductor pair orbit consistency between the installed cable segments and avoids the need for crossover connectors. Similar arrows on outwardly visible surfaces of the connectors, which when similarly pointed, facilitate choosing the correct connector genders by the installers.

In some embodiments of the present invention, the cable jacket 10*j* may include indicia adjacent to the male connector 40 that identifies the male connector 40, and/or indicia adjacent to the female connector 50 that identifies the female connector 50. This may be achieved by including, end to end, a continuum of closely spaced indicia 10*i* on the cable jacket 10*j*, thus ensuring availability of indicia near each connector regardless of the location where a cable segment is cut from a cable reel.

Figure 9A:
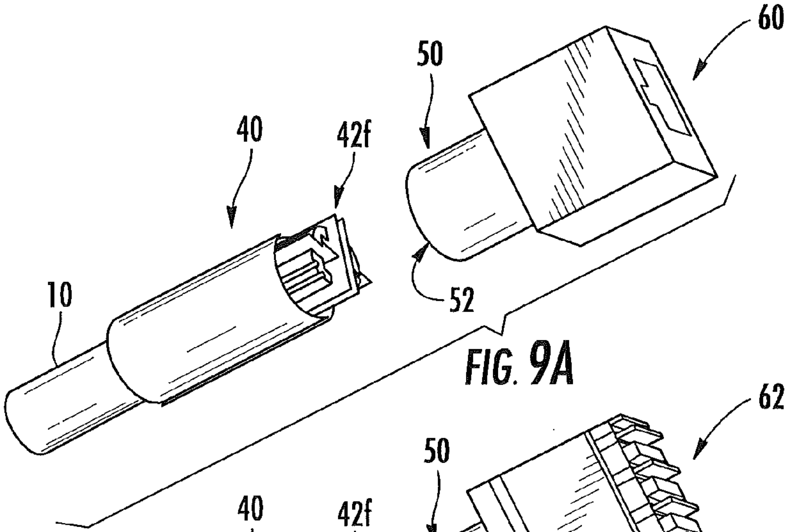
FIG. 9A is a perspective view of a male connector on the end of a communications cable and an RJ-45 jack end adapter with a female connector configured to be secured to the male connector, according to some embodiments of the present invention.
Figure 9B:
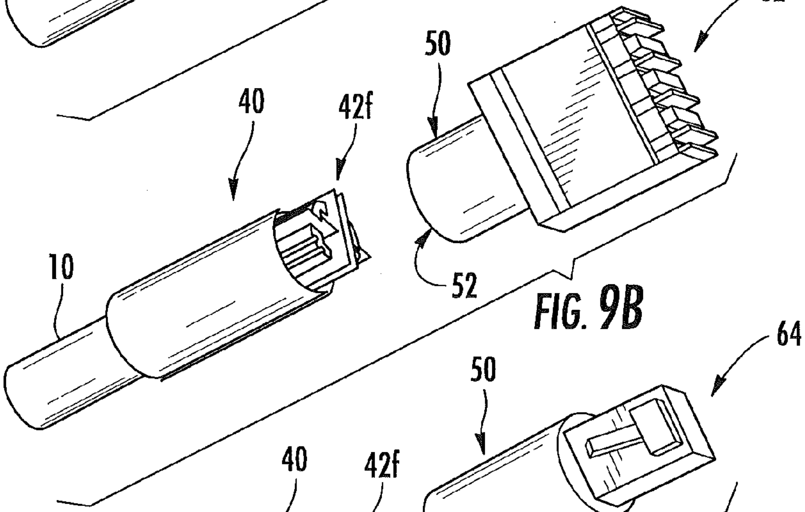
FIG. 9B is a perspective view of a male connector on the end of a communications cable and a 110 style IDC connector block end adapter with a female connector configured to be secured to the male connector, according to some embodiments of the present invention.
Figure 9C:
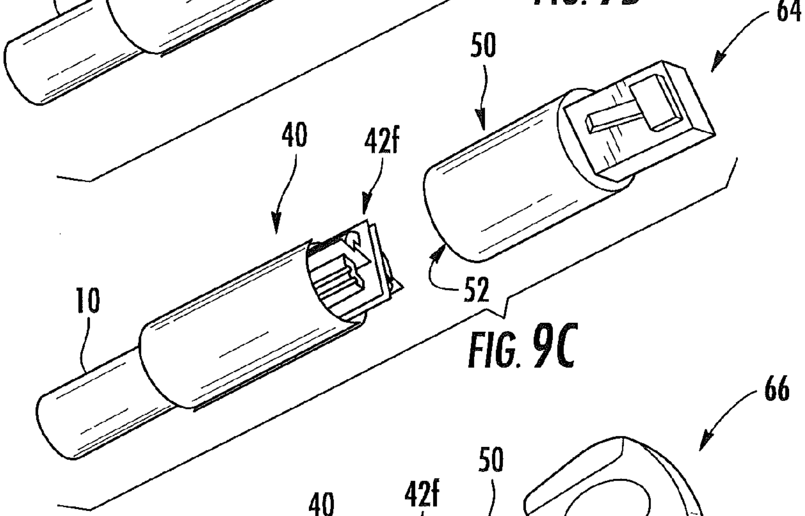
FIG. 9C is a perspective view of a male connector on the end of a communications cable and an RJ-45 plug end adapter with a female connector configured to be secured to the male connector, according to some embodiments of the present invention.
Figure 9D:
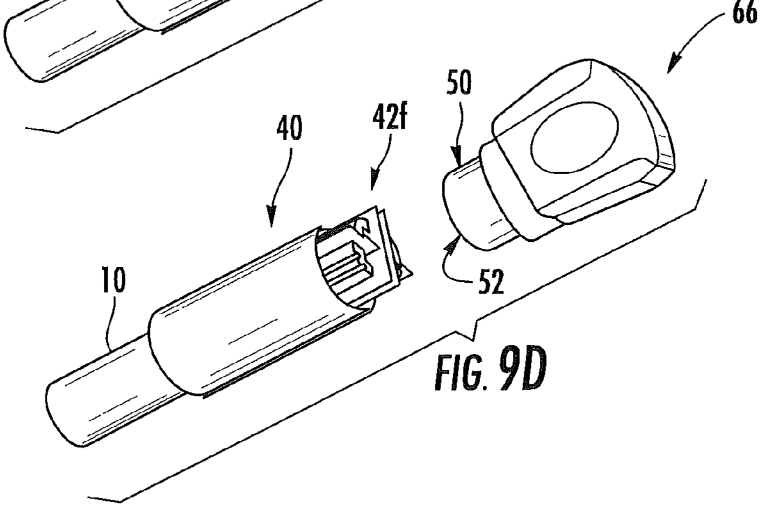
FIG. 9D is a perspective view of a male connector on the end of a communications cable and a 110 style plug end adapter with a female connector configured to be secured to the male connector, according to some embodiments of the present invention.

According to embodiments of the present invention, end adapters (FIGS. 9A-9D) may be configured to be secured to the male connector 40 of a cable 10. These end adapters allow cables with male and female connectors, according to embodiments of the present invention, to be utilized with all types of equipment and devices. The end adapter 60 of FIG. 9A is an RJ-45 jack. The end adapter 62 of FIG. 9B is a 110 style IDC connector block. The end adapter 64 of FIG. 9C is an RJ-45 plug. The end adapter 66 of FIG. 9D is a 110 style plug. Each of the end adapters 60, 62, 64, 66 (FIGS. 9A-9D) has a female connector 50 that is configured to matingly receive the male connector 40 of a cable 10 therein. Each female connector 50 has a core and collar as described above with respect to the male connector 40, but the female connector core is recessed within the adapter to form a receptacle 52 for matingly receiving the free end portion 42*f* of the core 42 of the male connector 40. The core of the female connector 50 will also include respective circumferentially spaced-apart chambers, and each chamber will include a termination block that receives the conducting elements of a respective twisted pair, as described above. Each termination block of a female connector 50 will also include a pair of termination connectors, each electrically connected to a respective conductive element of a twisted pair.

End adapters may also have male connectors 40, according to some embodiments of the present invention, such that they can be attached to female connectors 50 of communications cables 10.

Figure 10A:
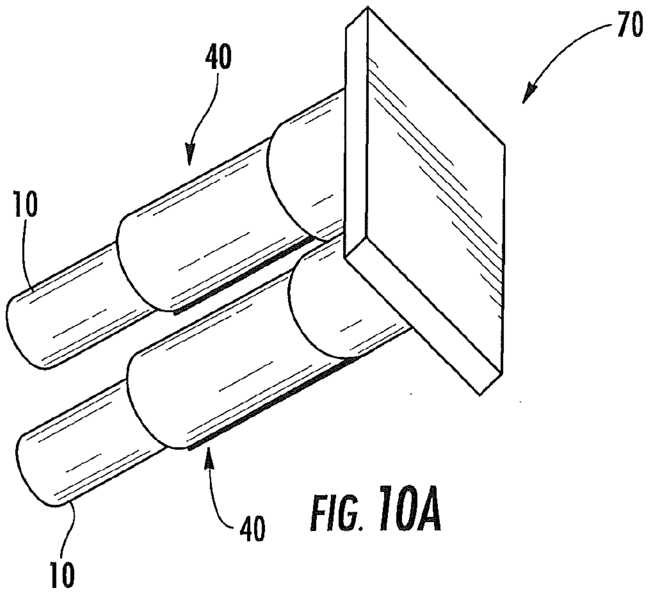
FIG. 10A is a perspective view of a printed wiring board (PWB) reversal connector with two communications cables connected thereto, according to some embodiments of the present invention.
Figure 10B:
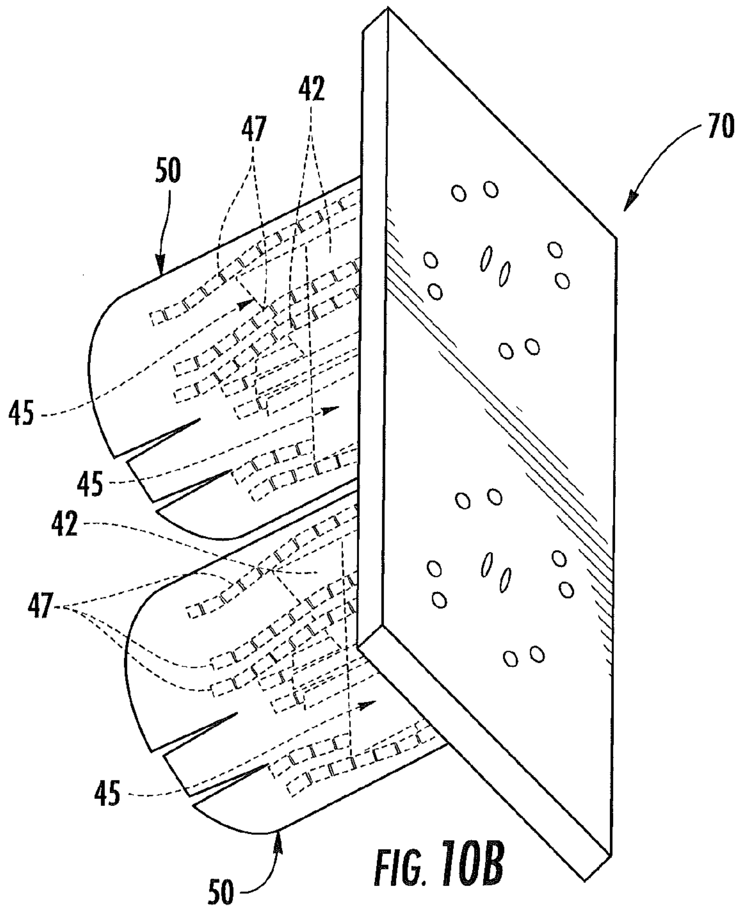
FIG. 10B is an enlarged perspective view of the PWB reversal connector of FIG. 10A illustrating the two female connectors.

Referring to FIGS. 10A and 10B, a printed wiring board (PWB) reversal connector 70 may be configured to be secured to the male connectors 40 of two cables 10. The PWB reversal connector 70 has a pair of female connectors 50 that are configured to matingly receive the male connectors 40 of two cables 10 therein. Each female connector 50 has a core 42 and collar as described above with respect to the male connector 40, but the female connector core 42 is recessed to form a receptacle for matingly receiving the free end portion 42*f* of the core 42 of the male connector 40, as illustrated. The core 42 of each female connector 50 will also include respective circumferentially spaced-apart chambers, and each chamber will include a termination block that receives the conducting elements of a respective twisted pair, as described above. Each termination block of a female connector 50 will also include a pair of termination connectors, each electrically connected to a respective conductive element of a twisted pair. In other embodiments, the male and female connectors 40, 50 may be interchanged with the PWB reversal connector 70 having male connectors 40 configured to be attached to female connectors 50 in cables 10.

Figure 11A:
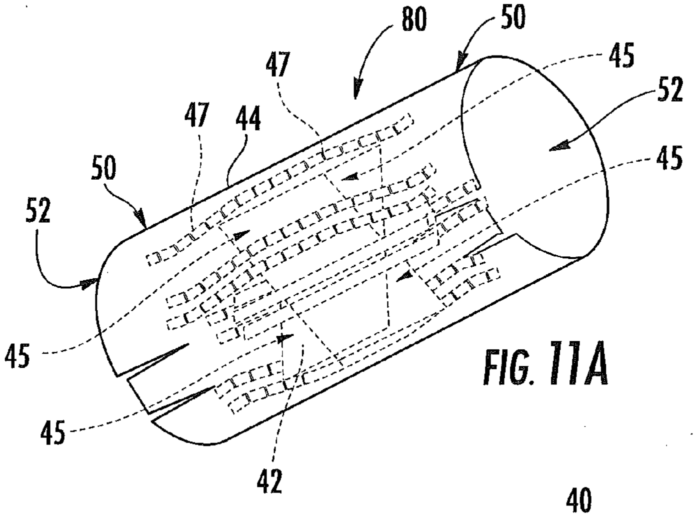
FIG. 11A is an enlarged perspective of a barrel connector with two female connectors, according to some embodiments of the present invention.
Figure 11B:
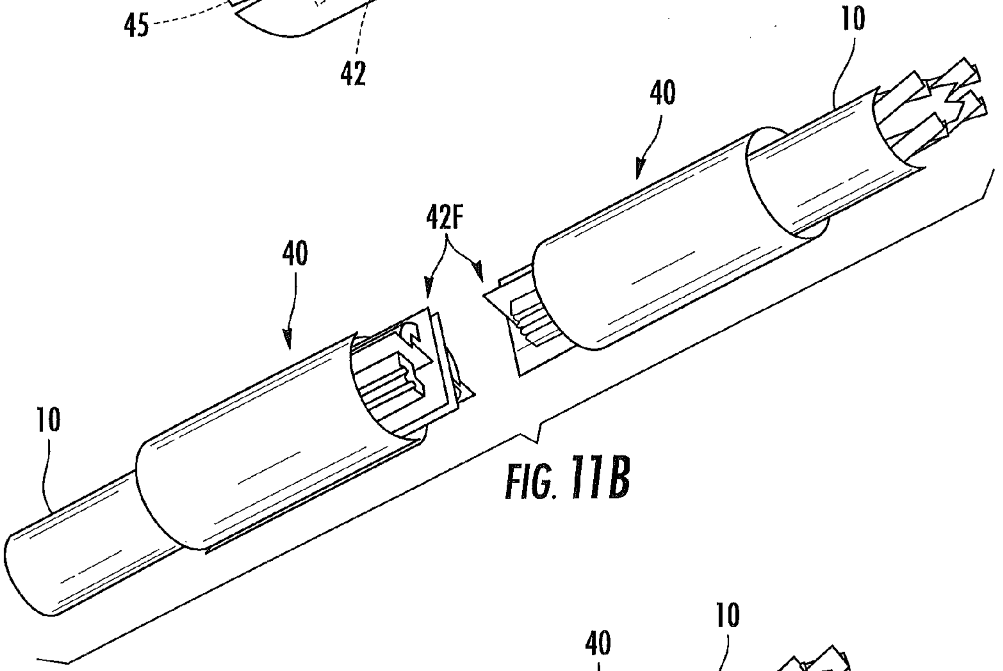
FIG. 11B is a perspective view of two cable ends with male connectors to be joined via the barrel connector of FIG. 11A.
Figure 11C:
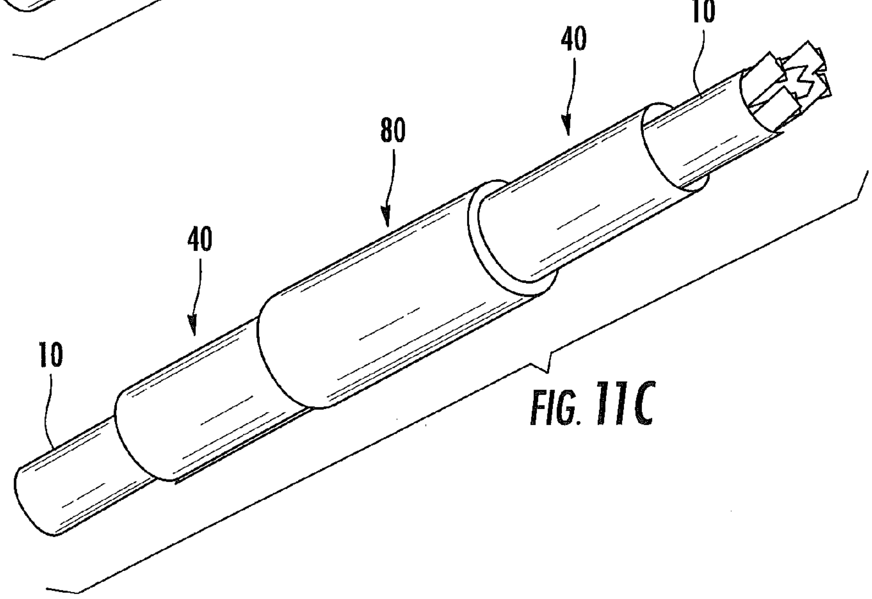
FIG. 11C illustrates the connection of the two cable ends of FIG. 11B with the barrel connector of FIG. 11A.

Referring now to FIGS. 11A-11C, a barrel connector 80 for use in joining two cables 10 (FIG. 11B) together, according to some embodiments of the present invention, is illustrated. The illustrated barrel connector 80 includes two female connectors 50, each configured to matingly receive the male connector 40 of a respective cable 10 therein. The two female connectors 50 are defined by a single core 42 and collar 44. The core 42 is recessed within the collar 44 to form receptacles 52 each configured to matingly receive the free end portion 42*f* of the core 42 of a male connector 40. The illustrated core 42 includes respective circumferentially spaced-apart chambers 45, as described above. Each chamber 45 also includes a termination block (not shown) and termination connectors 47, as described above. According to some embodiments of the present invention, all communications cables 10 in a communication channel 30 can have male connectors 40 on both ends and can be joined together with a barrel connector 80.

Figure 12:
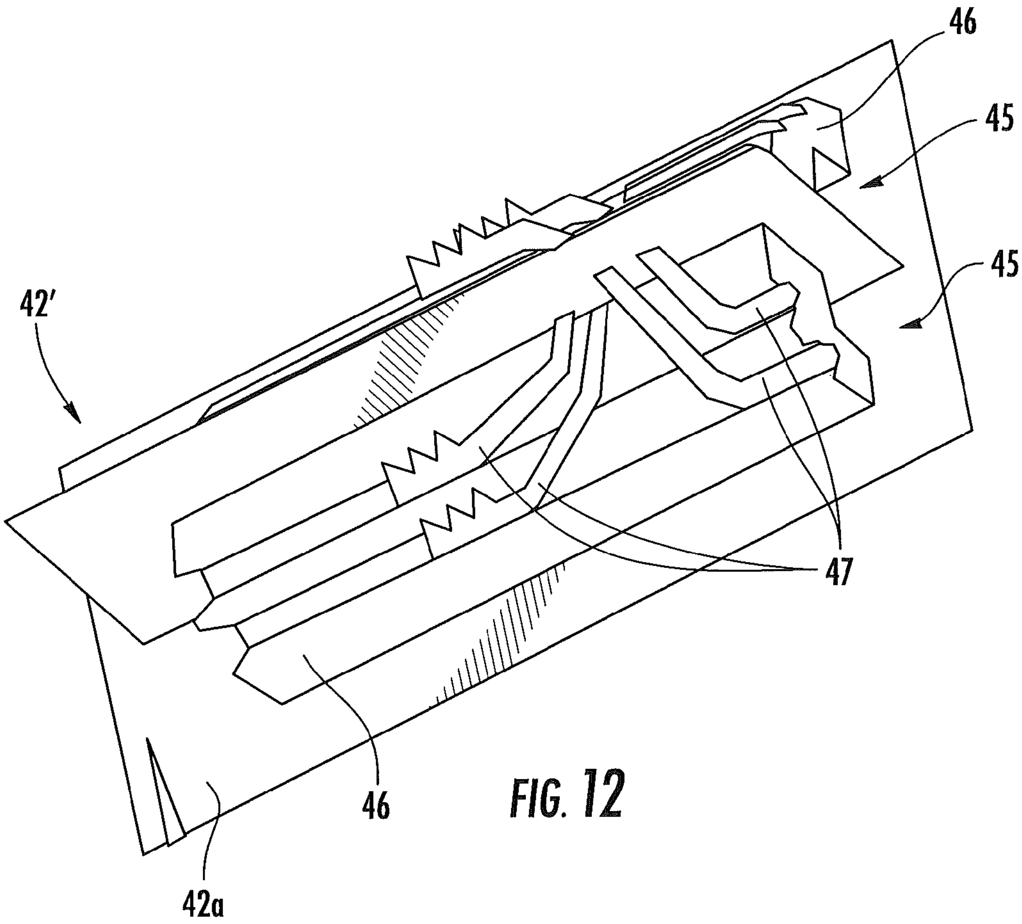
FIG. 12 is an enlarged partial perspective view of a cross-over connector core for a male and/or female connector, according to some embodiments of the present invention.

Referring to FIG. 12, in some embodiments of the present invention, the core 42 of the barrel connector of FIG. 11A may be a crossover core 42'. In FIG. 12, only one T-shaped component 42*a* of the crossover core 42' is illustrated for clarity. The crossover core 42' includes termination connectors 47 that cross over from one chamber 45 to an adjacent chamber 45.

Figure 13A:
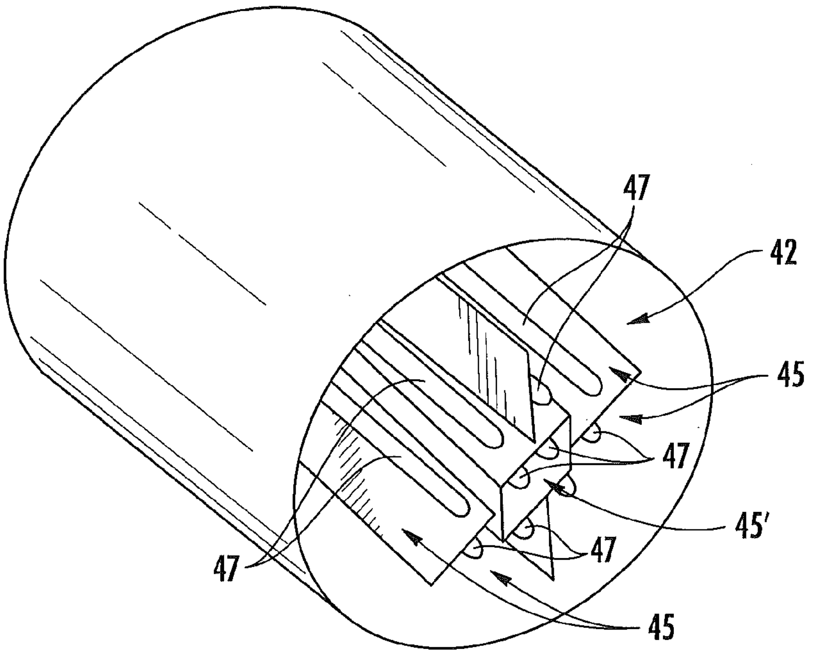
FIG. 13A is an enlarged perspective view of a connector core that supports a fifth twisted pair, according to some embodiments of the present invention.
Figure 13B:
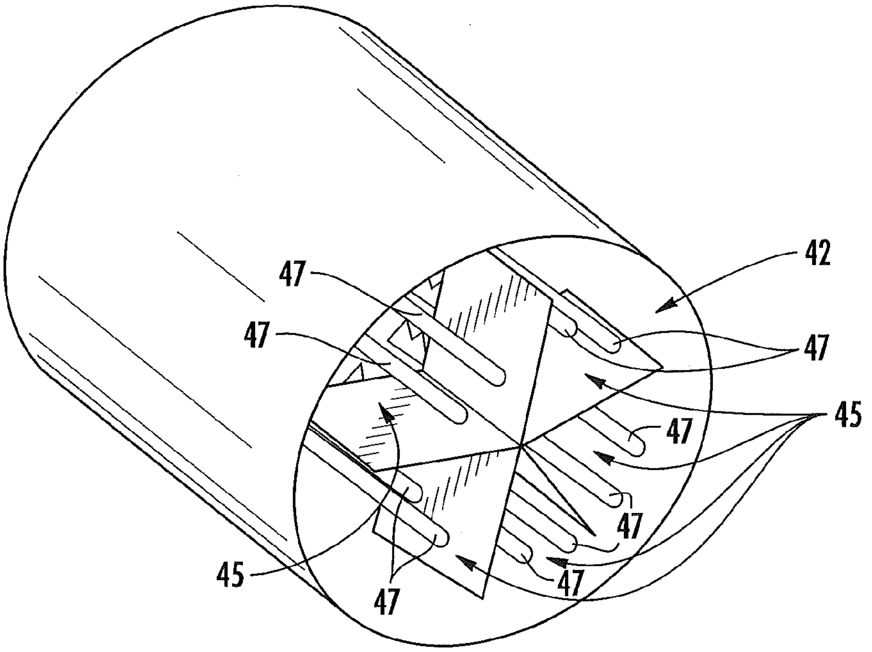
FIG. 13B is an enlarged perspective view of a connector core that supports a fifth twisted pair, according to other embodiments of the present invention.

Referring to FIGS. 13A and 13B, the male and female connectors 40, 50 described above may be configured to support a fifth twisted pair. In FIG. 13A, a connector core 42 includes central chamber 45' that receives a fifth twisted pair and four chambers 45 that each receive a respective twisted pair circumferentially spaced apart around the central chamber 45'. Each chamber 45, 45' includes a termination block (not shown) and termination connectors 47, as described above. In FIG. 13B, a connector core 42 includes five circumferentially spaced apart chambers 45 that each receive a respective twisted pair. Each chamber 45 includes a termination block (not shown) and termination connectors 47, as described above.

The foregoing is illustrative of the present invention and is not to be construed as limiting thereof. Although a few exemplary embodiments of this invention have been described, those skilled in the art will readily appreciate that many modifications are possible in the exemplary embodiments without materially departing from the teachings and advantages of this invention. Accordingly, all such modifications are intended to be included within the scope of this invention as defined in the claims. The invention is defined by the following claims, with equivalents of the claims to be included therein.

That which is claimed is:

1. A communications cable, comprising:

a plurality of longitudinally extending pairs of conducting elements; and a male connector secured to a first end of the cable and a female connector secured to an opposite second end of the cable, wherein the plurality of pairs of conducting elements terminate at the male connector in a first orientation and terminate at the female connector in a second orientation;

wherein the female connector and male connector are configured to matingly engage with each other, and wherein the first and second orientations are such that each respective conducting element can be connected to itself when the male and female connectors are matingly engaged with each other.

2. The communications cable of claim 1, wherein the male connector comprises:

a core having a plurality of circumferentially spaced-apart chambers, each chamber having a pair of termination connectors, each termination connector electrically connected to a respective conducting element of a pair; and a collar surrounding the core that secures the core to a cable jacket that surrounds the plurality of pairs of conducting elements, wherein a free end of the core extends outwardly from a free end of the collar.

3. The communications cable of claim 2, wherein the termination connectors are insulation-piercing connectors.

4. The communications cable of claim 2, wherein the plurality of pairs of conducting elements comprises four pairs of conducting elements, and wherein the core comprises four chambers.

5. The communications cable of claim 2, wherein the plurality of pairs of conducting elements comprises five pairs of conducting elements, and wherein the core comprises five chambers.

6. The communications cable of claim 2, wherein the plurality of pairs of conducting elements comprises five pairs of conducting elements, and wherein the core comprises a first chamber and four chambers circumferentially spaced apart around the first chamber.

7. The communications cable of claim 1, wherein the female connector comprises:

a core having a plurality of circumferentially spaced-apart chambers, each chamber having a pair of termination connectors, each termination connector electrically connected to a respective conducting element of a pair; and a collar surrounding the core that secures the core to a cable jacket that surrounds the plurality of pairs of conducting elements, wherein the core is recessed within the collar to form a receptacle for receiving a male connector.

8. The communications cable of claim 7, wherein the termination connectors are insulation-piercing connectors.

9. The communications cable of claim 1, further comprising a jacket that surrounds the plurality of pairs of conducting elements, and wherein the jacket comprises indicia that indicates a direction that the male and/or female connector should be oriented when the communications cable is installed in a communication channel of a network.

10. The communications cable of claim 9, wherein the male and female connectors each comprise indicia which collaborates with the indicia on the jacket.

11. The communications cable of claim 1, further comprising a jacket that surrounds the plurality of pairs of conducting elements, wherein the jacket comprises indicia adjacent to the male connector that identifies the male connector and indicia adjacent to the female connector that identifies the female connector.

12. The communications cable of claim 1, further comprising a jack end adapter configured to be secured to one of the male connector or the female connector.

13. The communications cable of claim 1, further comprising a plug end adapter configured to be secured to one of the male connector or female connector.

14. The communications cable of claim 1, further comprising a jacket that surrounds the plurality of pairs of conducting elements, wherein the jacket comprises a continuum of indicia that identifies the correct gender of a connector to be secured to each end of the cable.

* * * * *